US012704388B2

(12) United States Patent
Davis et al.

(10) Patent No.: US 12,704,388 B2
(45) Date of Patent: Aug. 11, 2026

(54) CAPACITIVE SMART ROAD FOR VEHICLE LOCALIZATION

(71) Applicant: Torc Robotics, Inc., Blacksburg, VA (US)

(72) Inventors: William Davis, Blacksburg, VA (US); Hamzah Khan, Blacksburg, VA (US); Christopher Harrison, Blacksburg, VA (US); Joseph R. Fox-Rabinovitz, Blacksburg, VA (US)

(73) Assignee: Torc Robotics, Inc., Blacksburg, VA (US)

( * ) Notice: Subject to any disclaimer, the term of this patent is extended or adjusted under 35 U.S.C. 154(b) by 199 days.

(21) Appl. No.: 18/642,351

(22) Filed: Apr. 22, 2024

(65) Prior Publication Data

US 2025/0327691 A1 Oct. 23, 2025

(51) Int. Cl.
*G01D 5/24* (2006.01)
*G01R 27/26* (2006.01)
*H01G 4/012* (2006.01)
*H01G 4/06* (2006.01)

(52) U.S. Cl.
CPC ............... *G01D 5/24* (2013.01); *H01G 4/012* (2013.01); *H01G 4/06* (2013.01); *G01R 27/2605* (2013.01)

(58) Field of Classification Search
CPC .. G01D 5/00; G01D 5/12; G01D 5/14; G01D 5/24; G01R 27/00; G01R 27/02; G01R 27/26; G01R 27/2605; H01G 4/00; H01G 4/002; H01G 4/005; H01G 4/012; H01G 4/018; H01G 4/06
USPC ......................... 324/600, 649, 658, 686, 688
See application file for complete search history.

(56) References Cited

U.S. PATENT DOCUMENTS 8,680,877 B2 * 3/2014 Lee ....................... G06F 3/0446 345/170
9,817,501 B2 * 11/2017 Wang .................... G06F 3/0445
10,717,411 B1 7/2020 Diehl
10,906,406 B1 2/2021 Healy
11,441,937 B2 9/2022 Zhang
11,787,418 B1 10/2023 Gudeta
(Continued)

FOREIGN PATENT DOCUMENTS

EP 3457263 A1 * 3/2019 ......... G06F 3/04166
WO WO-2023279234 A1 * 1/2023 ........... G06F 3/0448

*Primary Examiner* — Hoai-An D. Nguyen
(74) *Attorney, Agent, or Firm* — Armstrong Teasdale LLP

(57) ABSTRACT

A system including a plurality of first wires and a plurality of second wires is disclosed. Each second wire overlaps over one or more first wires at a respective overlapping area of one or more first wires. A dielectric material is disposed in a vertical gap at each respective overlapping area forming a capacitance sensor including a first electrode corresponding to a first wire and a second electrode corresponding to a second wire. The first and second electrodes are connected to a positive bias and a negative bias of at least one voltage source, respectively. The system includes at least one processor configured to periodically measure change in respective electric field of each capacitance sensor of a subset of capacitance sensors of a plurality of capacitance sensors, and store data corresponding to periodically measured change in the respective electric field of each capacitance sensor of the subset of capacitance sensors.

20 Claims, 4 Drawing Sheets

(56) References Cited

U.S. PATENT DOCUMENTS

| | | | | |
|---|---|---|---|---|
| 2013/0175591 | A1* | 7/2013 | Bairo | H10D 84/811<br>257/296 |
| 2022/0196459 | A1 | 6/2022 | Song | |

* cited by examiner

200

CAPACITIVE SMART ROAD FOR VEHICLE LOCALIZATION

TECHNICAL FIELD

The field of the disclosure relates generally to smart road infrastructure and, more specifically, to a capacitive smart road for vehicle localization.

BACKGROUND

Many cities are moving towards developing more effective roadways and highways using smart road infrastructure. At least some known smart roads are built based on internet-of-things (IoTs) and information and communications technology (ICT) that is used to collect and analyze data to improve day-to-day traffic management. Data collected from IoT sensors, cameras, radio detection and ranging (RADAR) sensors and communicated to mission control using 5G technologies, can be analyzed in near-real time to improve congested roadways, streamlining traffic flow, etc.

For example, in a scenario in which a car is behind a bus or a semi-truck in a driving lane, a driver of the car has an occluded view and may not know whether there is any other vehicle in front of the bus or semi-truck. As a result, it may be difficult for the driver of the car to decide whether to overtake the bus or semi-truck. In particular, when the car is an autonomous vehicle, it is important for the autonomous vehicle to have information about other vehicles, pedestrians, or debris on the road, when the view of the autonomous vehicle is occluded. In particular, cameras, RADAR sensors, and light detection and ranging (LiDAR) sensors that can be used to detects objects, such as vehicles, pedestrians, or debris in an unoccluded view fail to provide information about vehicles, pedestrian, or debris in an area that is occluded, for example, by a bus or semi-truck.

Accordingly, there exists a need for a smart road infrastructure that may be used to collect data to provide information about vehicles, pedestrians, debris, or other objects on the road and in an area occluded to a vehicle, such as an autonomous vehicle, a semi-autonomous vehicle, or a non-autonomous vehicle.

This section is intended to introduce the reader to various aspects of art that may be related to various aspects of the present disclosure described or claimed below. This description is believed to be helpful in providing the reader with background information to facilitate a better understanding of the various aspects of the present disclosure. Accordingly, it should be understood that these statements are to be read in this light and not as admissions of prior art.

SUMMARY

In one aspect, a system including a plurality of first wires and a plurality of second wires is disclosed. Each of the plurality of second wires overlaps over one or more wires of the plurality of first wires at a respective overlapping area of each of the one or more wires of the plurality of first wires. A dielectric material is disposed in a vertical gap at each respective overlapping area forming a capacitance sensor of a plurality of capacitance sensors. The capacitance sensor includes a first electrode and a second electrode. The first electrode corresponds with a wire of the plurality of first wires and the second electrode corresponds with a wire of the plurality of second wires. The system includes at least one voltage source having a positive bias connected to the first electrode of the capacitance sensor and a negative bias connected to the second electrode of the capacitance sensor, and at least one processor. The at least one processor is configured to periodically measure change in respective electric field of each capacitance sensor of a subset of capacitance sensors of the plurality of capacitance sensors, and store data corresponding to periodically measured change in the respective electric field of each capacitance sensor of the subset of capacitance sensors.

In another aspect, a grid of a plurality of capacitance sensors including a plurality of first wires and a plurality of second wires is disclosed. Each of the plurality of second wires overlaps over one or more wires of the plurality of first wires at a respective overlapping area of each of the one or more wires of the plurality of first wires. A dielectric material is disposed in a vertical gap at each respective overlapping area forming a capacitance sensor of a plurality of capacitance sensors. The capacitance sensor includes a first electrode and a second electrode. The first electrode corresponds with a wire of the plurality of first wires and the second electrode corresponds with a wire of the plurality of second wires. Each wire of the plurality of first wires has a first width and each wire of the plurality of the second wires has a second width. The grid includes at least one voltage source and at least one processor. A positive bias of the at least one voltage source is connected to the first electrode of the capacitance sensor and a negative bias of the at least one voltage source is connected to the second electrode of the capacitance sensor. The at least one processor is configured to periodically measure change in respective electric field of each capacitance sensor of a subset of capacitance sensors of the plurality of capacitance sensors, and store data corresponding to periodically measured change in the respective electric field of each capacitance sensor of the subset of capacitance sensors.

In yet another aspect, a grid of a plurality of capacitance sensors is disclosed. The grid includes a plurality of first wires each having a first width, and a plurality of second wires each having a second width and overlapping over one or more wires of the plurality of first wires at a respective overlapping area of each of the one or more wires of the plurality of first wires. A dielectric material is disposed in a vertical gap at each respective overlapping area forming a capacitance sensor of the plurality of capacitance sensors, wherein the capacitance sensor includes a first electrode and a second electrode. The first electrode corresponds with a wire of the plurality of first wires and the second electrode corresponds with a wire of the plurality of second wires. The grid includes at least one voltage source having a positive bias connected to the first electrode of the capacitance sensor and a negative bias connected to the second electrode of the capacitance sensor.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated examples may be incorporated into any of the above-described aspects, alone or in any combination.

BRIEF DESCRIPTION OF DRAWINGS

The following drawings form part of the present specification and are included to further demonstrate certain aspects of the present disclosure. The disclosure may be better understood by reference to one or more of these drawings in combination with the detailed description of specific embodiments presented herein.

Figure 1:
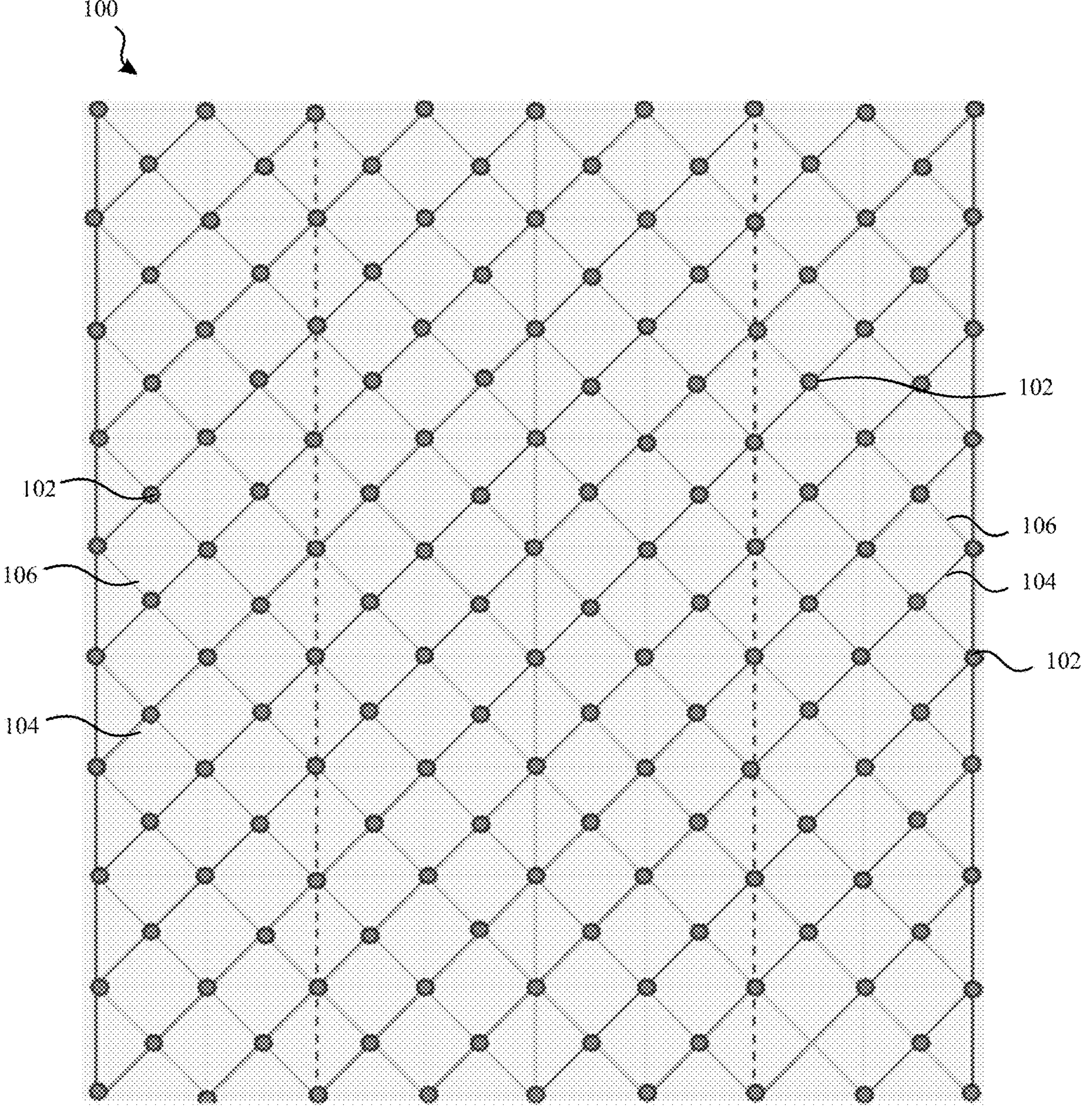
FIG. 1 is a simplified representation of a grid of a plurality of capacitance sensors.

Corresponding reference characters indicate corresponding parts throughout the several views of the drawings. Although specific features of various examples may be shown in some drawings and not in others, this is for convenience only. Any feature of any drawing may be referenced or claimed in combination with any feature of any other drawing.

DETAILED DESCRIPTION

The following detailed description and examples set forth preferred materials, components, and procedures used in accordance with the present disclosure. This description and these examples, however, are provided by way of illustration only, and nothing therein shall be deemed to be a limitation upon the overall scope of the present disclosure. The following terms are used in the present disclosure as defined below.

An autonomous vehicle: An autonomous vehicle is a vehicle that is able to operate itself to perform various operations such as controlling or regulating acceleration, braking, or steering wheel positioning, without any human intervention. An autonomous vehicle has an autonomy level of level-4 or level-5 recognized by National Highway Traffic Safety Administration (NHTSA).

A semi-autonomous vehicle: A semi-autonomous vehicle is a vehicle that is able to perform some of the driving related operations such as keeping the vehicle in lane or parking the vehicle without human intervention. A semi-autonomous vehicle has an autonomy level of level-1, level-2, or level-3 recognized by NHTSA. The semi-autonomous vehicle requires a human driver at all times for operating the semi-autonomous vehicle.

A non-autonomous vehicle: A non-autonomous vehicle is a vehicle that is driven by a human driver. A non-autonomous vehicle is neither an autonomous vehicle nor a semi-autonomous vehicle. A non-autonomous vehicle has an autonomy level of level-0 recognized by NHTSA.

Mission control: Mission control, also referenced herein as a centralized or regionalized control, is a hub in communication with one or more autonomous vehicles of a fleet. Database or datastore at mission control may store data received from the autonomous vehicles, and a smart road infrastructure. Mission control may analyze the stored data and identify information associated with various vehicles, pedestrians, or debris and their respective location on the smart road.

Smart road: A smart road described in the present disclosure refers to a road having a plurality of capacitive sensors arranged in a grid pattern, and identifying presence or absence of objects including, but not limited to, vehicles, pedestrians, or debris, etc., and sending data to mission control.

As described in the present disclosure, various embodiments describe a grid of capacitance sensors to provide localization of vehicles on a smart road without suffering from occlusion from other vehicles and objects. Each capacitance sensor in the grid of capacitance sensors may be connected to two different types of wires or electrodes connected to a voltage source across the wires or electrodes. When a voltage is applied to the electrodes or wires, an electric field is generated in the surrounding area. Accordingly, when an object comes close to the electrodes, the electric field is changed. The change in the electric field is detected and, based on the amount of change in the electric field, a type of the object on the smart road may be determined.

In some embodiments, the voltage may be applied to the electrodes or wires such that change in electric field of a particular capacitance sensor of the grid of capacitance sensors may be identified. In some embodiments, the voltage may be applied to determine change in electric field of capacitance sensors along a specific wire. Further, voltage may be applied to multiple wires separated by a predetermined distance, such that change in electric field of more than one capacitance sensor along those wires may indicate a specific type of object on the road, e.g., a pedestrian, a vehicle, or debris.

In some embodiments, data corresponding to a change in electric field for one or more capacitance sensors of the grid may be received by a computing device (e.g., a processor, a microcontroller, etc.) and may be analyzed, by the computing device, to determine an object causing a change in the electric field and location of the object on the grid. In the exemplary embodiment, location of the object on the grid may be determined based upon geolocation of the capacitance sensor on the grid. Additionally, or alternatively, the computing device may transmit the data corresponding to a change in electric field for one or more capacitance sensors of the grid to mission control.

Accordingly, in some embodiments, the grid of wires may be embedded into the road, and capacitance sensors may be placed at small intervals throughout the road. By checking for a change in capacitance across the grid, the system detects the location of an object on the surface. Further, by using multiplexing on the sensor wires, a change in electric field of a single sensor may be identified, which may be used to determine the precise location of the object on the road. Further, the wires for the grid may be arranged to run diagonally with respect to the road, and, thereby, reducing the number of sensors needed on any one wire in comparison with a grid in which the wires are arranged to run along the entire length of the road. As an advantage of fewer sensors connected to each wire when the wires of the grid are arranged to run diagonally to the road, a faster reading scan may be made with higher accuracy of the data, and, additionally, allowing for sectional repair of damaged wires. With sufficiently close sensors, each wheel of a vehicle may be across multiple sensors, which may increase the effective resolution.

In some embodiments, a capacitance sensor may be formed using two different electrodes or wires forming two plates of the capacitance sensors separated by a layer of a dielectric material. Capacitive coupling of each capacitance sensor of the grid thus depends on the overlapping area formed by two different wires running diagonally on the road. Accordingly, the wires width may be selected to form a capacitive coupling of a specific threshold value. Additionally, or alternatively, a vertical distance between the two different wires in the overlapping area, or the height of the layer of the dielectric material may also be selected based on the desired specific threshold capacitive coupling. In some embodiments, and by way of a non-limiting example, a dielectric material with a specific dielectric constant may also be used to achieve the capacitive coupling of a specific threshold value. By way of a non-limiting example, the dielectric material used in the capacitance sensor of the grid may include plastics, ceramics, or paper, and the wires may be made from copper, indium tin oxide (ITO), aluminum oxide, or printed ink. The grid may be manufactured as an embedding in a mat that can be laid on the road such that any section of the grid can be maintained or replaced easily when required. In some embodiments, capacitance sensors of the grid may be replaced with other types of pressure sensors such as, piezoelectric sensors, etc.

Various features or embodiments described above are discussed in more detail below with respect to FIGS. 1-4.

FIG. 1 is a simplified representation of a grid 100 of a plurality of capacitance sensors. As shown in FIG. 1, the grid 100 includes a plurality of capacitance sensors 102. The plurality of capacitance sensors 102 are formed from a plurality of first wires 104 and a plurality of second wires 106 arranged to run diagonally in orthogonal directions, or in orthogonal directions, while overlapping. The plurality of first wires 104 and the plurality of second wires 106 are separated by a predetermined horizontal distance, and thereby form a less or a greater number of capacitance sensors 102*s* based on a length and a width of the grid 100.

Figure 2:
FIG. 2 is an illustration of a capacitance sensor of the grid shown in FIG. 1.
Figure 2:
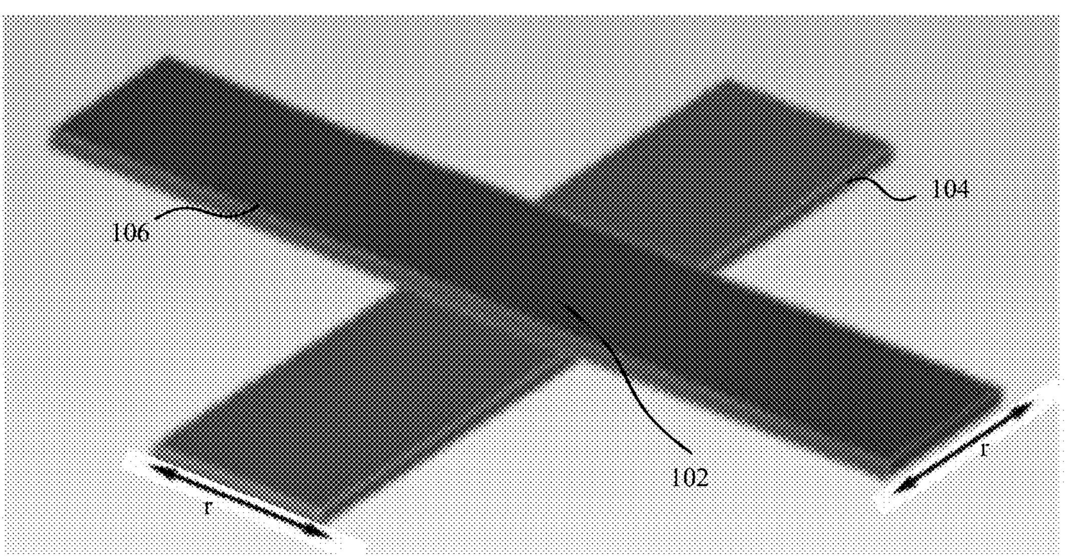

FIG. 2 is an illustration 200 of a capacitance sensor 102 of the grid 100 formed from overlapping of two different wires 104 and 106. The overlapping area of the wires 104 and 106 forms the capacitance sensor. A vertical gap distance between the wires 104 and 106 (shown in FIG. 3) may be filled with one or more dielectric materials as described herein. The wires 104 and 106 each may have a width of r, and hence the electrodes or plates of the capacitance sensor 102 thus formed may be of a square shape with each side having a length of r. Additionally, or alternatively, the wires 104*s* may have a width r1 and wires 106*s* may have a width r2. By way of a non-limiting example, the width r1 may be same as the width r2, or the width r1 may be different from the width r2. Depending on whether the width r1 is same as the width r2 or different from the width r2, the electrodes or plates of the capacitance sensor 102 thus formed may either have a square shape or a rectangular shape.

Figure 3:
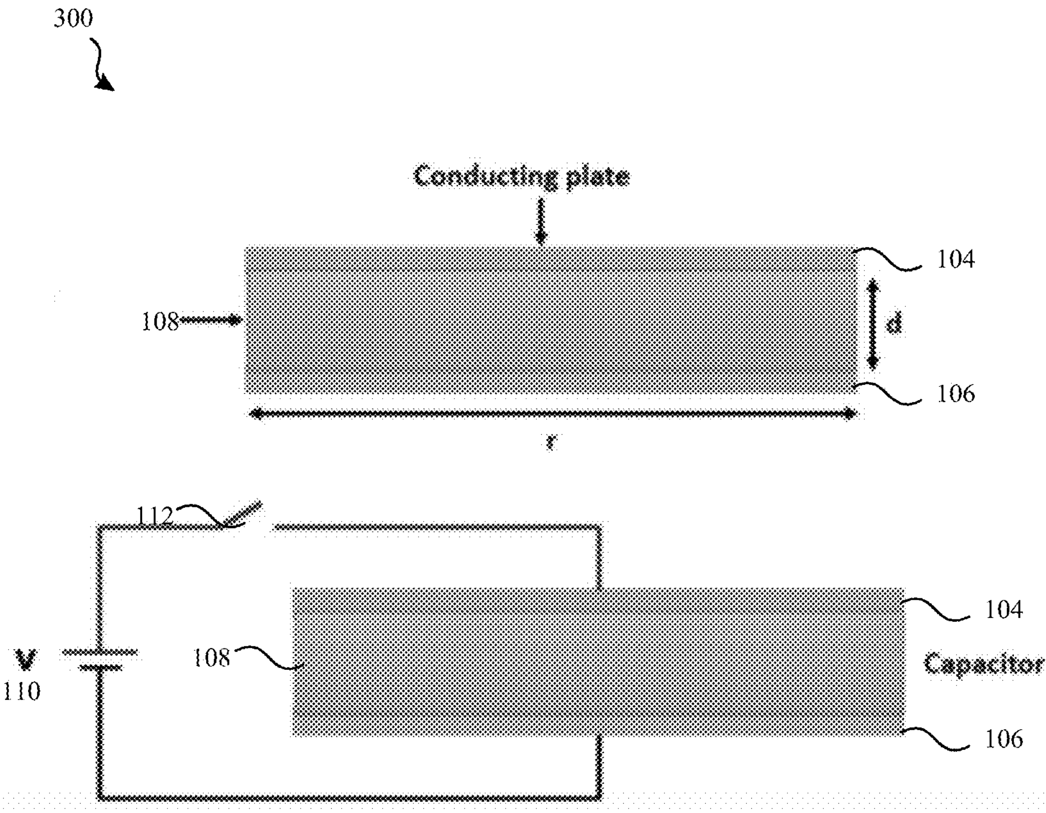
FIG. 3 is an illustration of a cross sectional or side view of the capacitance sensor of the grid shown in FIG. 1.

FIG. 3 is an illustration of a cross sectional or side view 300 of the capacitance sensor 102 formed from the wires 104 and 106 overlapping over each other with a layer 108 of dielectric material. As shown in FIG. 3, a height or depth of the layer 108 of dielectric material may be d and the capacitance sensor 102 may have electrode plates of a square shape of length r based on the wires 104 and 106 having the same width as shown in FIG. 2. The electrode plates or conducting plates of the capacitance sensor 102 may be connected to a positive bias and a negative bias of a voltage source 110, respectively. As described herein, switch 112 may be operated to generate and store charge by the capacitance sensor 102, which may generate an electric field around the capacitance sensor 102. An object, such as a vehicle, a pedestrian, or debris, coming in proximity of the capacitance sensor 102 may cause a change in the electric field and thereby change in the capacitance value of the capacitance sensor 102. By way of a non-limiting example, the change in the capacitance value of the capacitance sensor 102 may be periodically measured and reported to a computing device for storage and/or transmitting to mission control.

Figure 4:
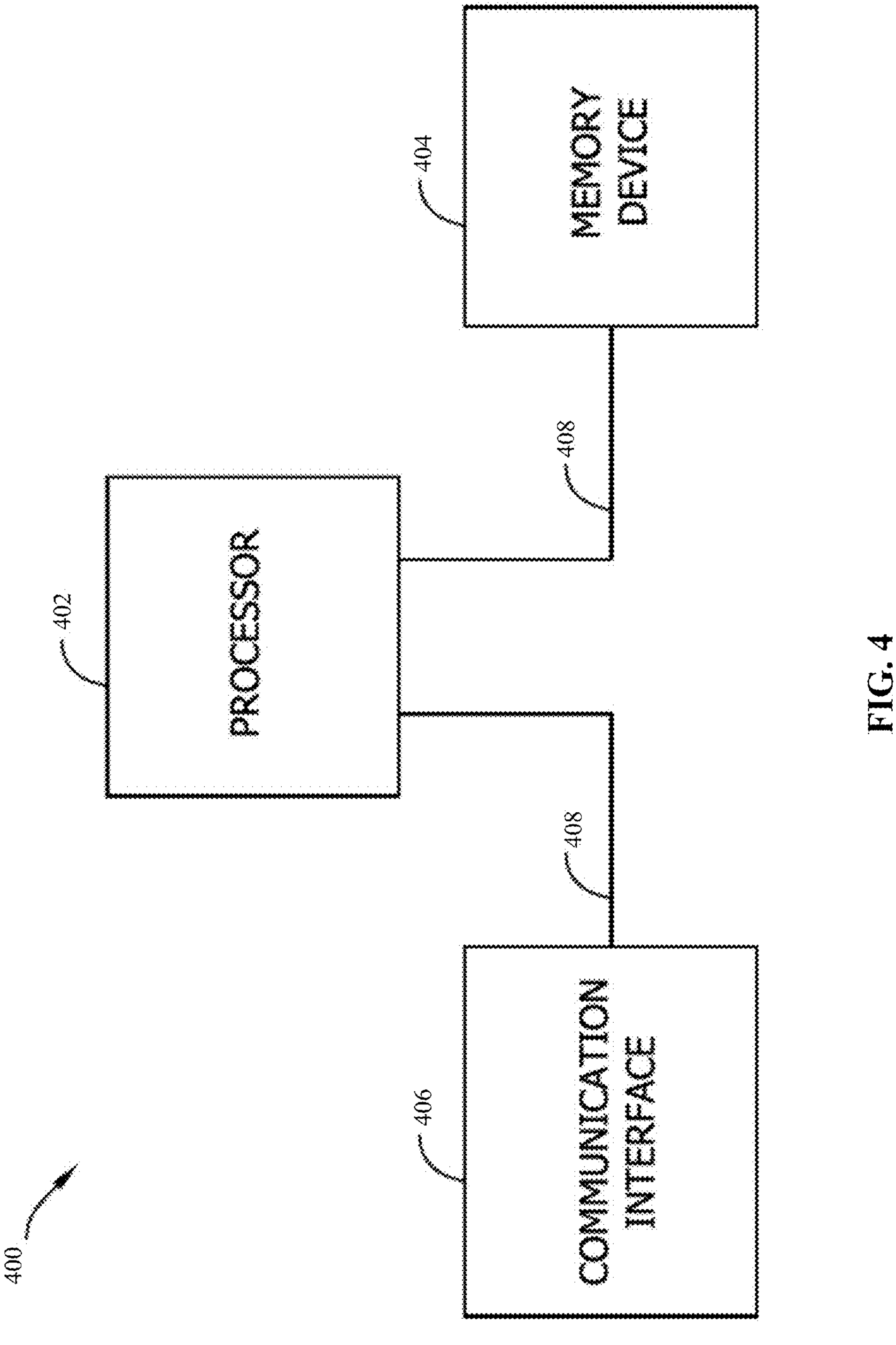
FIG. 4 is a block diagram of an example computing device.

FIG. 4 is a block diagram of an example computing device 400. Computing device 400 includes a processor 402 and a memory device 404. The processor 402 is coupled to the memory device 404 via a system bus 408. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are example only, and thus are not intended to limit in any way the definition or meaning of the term "processor."

The processor 402 may be configured to execute instructions stored in the memory device 404 to periodically measure change in respective electric field of each capacitance sensor of a subset of capacitance sensors of the plurality of capacitance sensors of the grid 100 shown in FIG. 1. The processor 402 may store data corresponding to periodically measured change in the respective electric field of each capacitance sensor of the subset of capacitance sensors in the memory device 404. In some embodiments, and by way of a non-limiting example, the subset of capacitance sensors of the plurality of capacitance sensors is selected corresponding to a size of an object causing change in the respective electric field of each capacitance sensor of the subset of capacitance sensors or based on a dimension of a vehicle.

In the example embodiment, the memory device 404 includes one or more devices that enable information, such as executable instructions or other data (e.g., sensor data), to be stored and retrieved. Moreover, the memory device 404 includes one or more computer readable media, such as, without limitation, dynamic random access memory (DRAM), static random access memory (SRAM), a solid state disk, or a hard disk. In the example embodiment, the memory device 404 stores, without limitation, application source code, application object code, configuration data, additional input events, application states, assertion statements, validation results, or any other type of data. The computing device 400, in the example embodiment, may also include a communication interface 506 that is coupled to the processor 402 via system bus 408. Moreover, the communication interface 406 is communicatively coupled to data acquisition devices, a computing device, a client computing system, mission control, etc.

In the example embodiment, processor 402 may be programmed by encoding an operation using one or more executable instructions and providing the executable instructions in the memory device 404. In the example embodiment, the processor 402 is programmed to select a plurality of measurements that are received from data acquisition devices.

In operation, a computer executes computer-executable instructions embodied in one or more computer-executable components stored on one or more computer-readable media to implement aspects of the disclosure described or illustrated herein. The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Some embodiments involve the use of one or more electronic processing or computing devices. As used herein, the terms "processor" and "computer" and related terms, e.g., "processing device," and "computing device" are not limited to just those integrated circuits referred to in the art as a computer, but broadly refers to a processor, a processing device or system, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processor (DSP), an application specific integrated circuit (ASIC), and other programmable circuits or processing devices capable of executing the functions described herein, and these terms are used interchangeably herein. These processing devices are generally "configured" to execute functions by programming or being programmed, or by the provisioning of instructions for execution. The above examples are not intended to limit in any way the definition or meaning of the terms processor, processing device, and related terms.

The various aspects illustrated by logical blocks, modules, circuits, processes, algorithms, and algorithm steps described above may be implemented as electronic hardware, software, or combinations of both. Certain disclosed components, blocks, modules, circuits, and steps are described in terms of their functionality, illustrating the interchangeability of their implementation in electronic hardware or software. The implementation of such functionality varies among different applications given varying system architectures and design constraints. Although such implementations may vary from application to application, they do not constitute a departure from the scope of this disclosure.

Aspects of embodiments implemented in software may be implemented in program code, application software, application programming interfaces (APIs), firmware, middleware, microcode, hardware description languages (HDLs), or any combination thereof. A code segment or machine-executable instruction may represent a procedure, a function, a subprogram, a routine, a subroutine, a module, a software package, a class, or any combination of instructions, data structures, or program statements. A code segment may be coupled to, or integrated with, another code segment or an electronic hardware by passing or receiving information, data, arguments, parameters, memory contents, or memory locations. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the disclosed functions may be embodied, or stored, as one or more instructions or code on or in memory. In the embodiments described herein, memory includes non-transitory computer-readable media, which may include, but is not limited to, media such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROM, DVD, and any other digital source such as a network, a server, cloud system, or the Internet, as well as yet to be developed digital means, with the sole exception being a transitory propagating signal. The methods described herein may be embodied as executable instructions, e.g., "software" and "firmware," in a non-transitory computer-readable medium. As used herein, the terms "software" and "firmware" are interchangeable and include any computer program stored in memory for execution by personal computers, workstations, clients, and servers. Such instructions, when executed by a processor, configure the processor to perform at least a portion of the disclosed methods.

As used herein, an element or step recited in the singular and proceeded with the word "a" or "an" should be understood as not excluding plural elements or steps unless such exclusion is explicitly recited. Furthermore, references to "one embodiment" of the disclosure or an "exemplary" or "example" embodiment are not intended to be interpreted as excluding the existence of additional embodiments that also incorporate the recited features. Likewise, limitations associated with "one embodiment" or "an embodiment" should not be interpreted as limiting to all embodiments unless explicitly recited.

Disjunctive language such as the phrase "at least one of X, Y, or Z," unless specifically stated otherwise, is generally intended, within the context presented, to disclose that an item, term, etc. may be either X, Y, or Z, or any combination thereof (e.g., X, Y, and/or Z). Likewise, conjunctive language such as the phrase "at least one of X, Y, and Z," unless specifically stated otherwise, is generally intended, within the context presented, to disclose at least one of X, at least one of Y, and at least one of Z.

The disclosed systems and methods are not limited to the specific embodiments described herein. Rather, components of the systems or steps of the methods may be utilized independently and separately from other described components or steps.

This written description uses examples to disclose various embodiments, which include the best mode, to enable any person skilled in the art to practice those embodiments, including making and using any devices or systems and performing any incorporated methods. The patentable scope is defined by the claims and may include other examples that occur to those skilled in the art. Such other examples are intended to be within the scope of the claims if they have structural elements that do not differ from the literal language of the claims, or if they include equivalent structural elements with insubstantial differences form the literal language of the claims.

What is claimed is:

1. A capacitive road system for a road, the capacitive road system comprising:

a plurality of first wires;

a plurality of second wires, each of the plurality of second wires overlapping over one or more wires of the plurality of first wires at a respective overlapping area of each of the one or more wires of the plurality of first wires;

a dielectric material disposed in a vertical gap between a wire of the plurality of first wires and a wire of the plurality of second wires forming each respective overlapping area, the dielectric material, a first electrode, and a second electrode forming a capacitance sensor of a plurality of capacitance sensors, wherein the first electrode corresponds to the wire of the plurality of first wires at each respective overlapping area and the second electrode corresponds to the wire of the plurality of second wires at each respective overlapping area, wherein the plurality of capacitance sensors are embedded at designated intervals into the road;

at least one voltage source having a positive bias connected to the first electrode of the capacitance sensor and a negative bias connected to the second electrode of the capacitance sensor; and at least one processor configured to:

periodically measure change in respective electric field of each capacitance sensor of a subset of capacitance sensors of the plurality of capacitance sensors, the periodically measured change corresponding to one or more objects on the surface of the road and usable to locate the one or more objects on the road relative to the designated intervals;

determine locations of the one or more objects on the road, based on geolocations of the first electrode and the second electrode; and store data corresponding to periodically measured change in the respective electric field of each capacitance sensor of the subset of capacitance sensors.

2. The system of claim 1, wherein the plurality of first wires and the plurality of second wires are laid out to run diagonally in opposite directions while overlapping.

3. The system of claim 1, wherein each of the plurality of first wires or each of the plurality of second wires has a width of a predetermined value.

4. The system of claim 1, wherein the vertical gap at each respective overlapping area filled with the dielectric material has a height of a predetermined value.

5. The system of claim 1, wherein the dielectric material includes one of plastics, ceramic, or paper.

6. The system of claim 1, wherein the plurality of first wires and the plurality of second wires are laid out as separated by a predetermined horizontal distance.

7. The system of claim 1, wherein the subset of capacitance sensors of the plurality of capacitance sensors is selected corresponding to a size of an object causing change in the respective electric field of each capacitance sensor of the subset of capacitance sensors.

8. The system of claim 7, wherein the subset of capacitance sensors of the plurality of capacitance sensors is selected based on a dimension of a vehicle configured to drive on the road.

9. A grid of a plurality of capacitance sensors for a capacitive road system for a road, the grid comprising:

a plurality of first wires;

a plurality of second wires, each of the plurality of second wires overlapping over one or more wires of the plurality of first wires at a respective overlapping area of each of the one or more wires of the plurality of first wires;

a dielectric material disposed in a vertical gap between a wire of the plurality of first wires and a wire of the plurality of second wires forming each respective overlapping area, the dielectric material, a first electrode, and a second electrode forming a capacitance sensor of the plurality of capacitance sensors, wherein the first electrode corresponds to the wire of the plurality of first wires at each respective overlapping area and the second electrode corresponds to the wire of the plurality of second wires at each respective overlapping area, each wire of the plurality of first wires having a first width and each wire of the plurality of the second wires having a second width, wherein the plurality of capacitance sensors are embedded at designated intervals into the road;

at least one voltage source having a positive bias connected to the first electrode of the capacitance sensor and a negative bias connected to the second electrode of the capacitance sensor; and at least one processor configured to:

periodically measure change in respective electric field of each capacitance sensor of a subset of capacitance sensors of the plurality of capacitance sensors, the periodically measured change corresponding to one or more objects on the surface of the road and usable to locate the one or more objects on the road relative to the designated intervals;

determine locations of the one or more objects on the road, based on geolocations of the first electrode and the second electrode; and store data corresponding to periodically measured change in the respective electric field of each capacitance sensor of the subset of capacitance sensors.

10. The grid of claim 9, wherein the plurality of first wires and the plurality of second wires are laid out to run diagonally in opposite directions while overlapping.

11. The grid of claim 9, wherein the first width is same as the second width.

12. The grid of claim 9, wherein the vertical gap at each respective overlapping area filled with the dielectric material has a height of a predetermined value.

13. The grid of claim 9, wherein the dielectric material includes one of plastics, ceramic, or paper.

14. The grid of claim 9, wherein the plurality of first wires and the plurality of second wires are laid out as separated by a predetermined horizontal distance.

15. The grid of claim 9, wherein the subset of capacitance sensors of the plurality of capacitance sensors is selected corresponding to a size of an object causing change in the respective electric field of each capacitance sensor of the subset of capacitance sensors.

16. The grid of claim 15, wherein the subset of capacitance sensors of the plurality of capacitance sensors is selected based on a dimension of a vehicle configured to drive on the road.

17. A grid of a plurality of capacitance sensors for a capacitive road system for a road, the grid comprising:

a plurality of first wires each having a first width;

a plurality of second wires each having a second width and overlapping over one or more wires of the plurality of first wires at a respective overlapping area of each of the one or more wires of the plurality of first wires;

a dielectric material disposed in a vertical gap between a wire of the plurality of first wires and a wire of the plurality of second wires forming each respective overlapping area, the dielectric material, a first electrode, and a second electrode forming a capacitance sensor of the plurality of capacitance sensors, wherein the first electrode corresponds to the wire of the plurality of first wires at each respective overlapping area and the second electrode corresponds to the wire of the plurality of second wires at each respective overlapping area, wherein the plurality of capacitance sensors are embedded at designated intervals into the road; and at least one voltage source having a positive bias connected to the first electrode of the capacitance sensor and a negative bias connected to the second electrode of the capacitance sensor, wherein the grid is communicatively coupled to at least one processor that is configured to:

periodically measure change corresponding to one or more objects on the surface of the road and usable to locate the one or more objects on the road relative to the designated intervals; and determine locations of the one or more objects on the road, based on geolocations of the first electrode and the second electrode.

18. The grid of claim 17, wherein the grid is communicatively coupled to the at least one processor that is further configured to:

periodically measure, as the change corresponding to the one or more objects on the surface of the road, change in the respective electric field of each capacitance sensor of a subset of capacitance sensors of the plurality of capacitance sensors; and store data corresponding to periodically measured change in the respective electric field of each capacitance sensor of the subset of capacitance sensors.

19. The grid of claim 17, wherein the plurality of first wires and the plurality of second wires are laid out to run orthogonally while overlapping.

20. The grid of claim 17, wherein the first width is same as the second width.

* * * * *